United States Patent
Zhang et al.

(10) Patent No.: US 11,671,922 B2
(45) Date of Patent: Jun. 6, 2023

(54) METHOD AND APPARATUS FOR DETECTING STATE OF PROXIMITY SENSOR, TERMINAL AND NON-TRANSITORY COMPUTER-READABLE STORAGE MEDIUM

(71) Applicant: BEIJING XIAOMI MOBILE SOFTWARE CO., LTD., Beijing (CN)

(72) Inventors: Hua Zhang, Beijing (CN); Cong Peng, Beijing (CN); Yaqi Liu, Beijing (CN); Liping Wang, Beijing (CN); Xin Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 134 days.

(21) Appl. No.: 17/211,790

(22) Filed: Mar. 24, 2021

(65) Prior Publication Data
US 2022/0039025 A1    Feb. 3, 2022

(30) Foreign Application Priority Data

Jul. 29, 2020    (CN) .......................... 202010745820.9

(51) Int. Cl.
*H04W 52/18*    (2009.01)
*H04B 17/10*    (2015.01)
*G08B 21/18*    (2006.01)

(52) U.S. Cl.
CPC ............ *H04W 52/18* (2013.01); *G08B 21/18* (2013.01); *H04B 17/10* (2015.01)

(58) Field of Classification Search
CPC ..... H04W 52/18; H04W 52/283; H04W 4/80; G08B 21/18; H04B 17/10; H04B 1/3838;
(Continued)

(56) References Cited

U.S. PATENT DOCUMENTS 9,621,212 B2 *   4/2017   Shi .......................... H01Q 1/245
9,867,139 B1 *   1/2018   Khasgiwala ......... H04B 17/318
(Continued)

FOREIGN PATENT DOCUMENTS

CN      104269605 A   *   1/2015
CN      107534805 A       1/2018
WO   WO-2022248207 A1   *  12/2022

OTHER PUBLICATIONS

Extended European Search Report (EESR) in EP 21165448.8 dated Sep. 23, 2021.
(Continued)

*Primary Examiner* — Lana N Le
(74) *Attorney, Agent, or Firm* — Syncoda LLC; Feng Ma

(57) ABSTRACT

A method for detecting the state of the proximity sensor, applied to a terminal including the proximity sensor and an antenna, includes: sending a predetermined instruction to the proximity sensor; determining whether the proximity sensor is abnormal based on a feedback result of the proximity sensor to the predetermined instruction; and maintaining the antenna transmitting power at a low power if the proximity sensor is abnormal. Through the feedback of the proximity sensor to the request to obtain the capacitance value, it is determined whether the proximity sensor can work normally, and in a case that the proximity sensor cannot work normally, the antenna transmitting power is reduced to avoid the continuous high antenna transmitting power due to the inability of the proximity sensor to work normally, which reduces the radiation to the human body.

18 Claims, 5 Drawing Sheets

(58) Field of Classification Search
CPC .......... H04B 2203/5445; H03K 2217/960705; H03K 17/955; H04M 1/026; H04M 1/24; G01V 13/00
See application file for complete search history.

(56) References Cited

U.S. PATENT DOCUMENTS

| | | | |
|---|---|---|---|
| 2006/0097734 A1* | 5/2006 | Roziere | H03K 17/955 |
| | | | 324/662 |
| 2013/0207677 A1 | 8/2013 | Togura | |
| 2015/0253372 A1 | 9/2015 | Watanabe et al. | |
| 2016/0066286 A1 | 3/2016 | Anzai | |
| 2016/0353184 A1* | 12/2016 | Sindia | H04W 52/367 |
| 2019/0020191 A1* | 1/2019 | Fernandez | G01V 3/088 |
| 2019/0075503 A1* | 3/2019 | Bae | H04W 52/343 |
| 2022/0039025 A1* | 2/2022 | Zhang | H04W 52/18 |

OTHER PUBLICATIONS

1st Office Action of Chinese Patent Application No. 202010745820.9 dated May 8, 2021.

* cited by examiner

METHOD AND APPARATUS FOR DETECTING STATE OF PROXIMITY SENSOR, TERMINAL AND NON-TRANSITORY COMPUTER-READABLE STORAGE MEDIUM

CROSS-REFERENCE TO RELATED APPLICATION

This application claims priority to Chinese Patent Application No. 202010745820.9 filed on Jul. 29, 2020, the disclosure of which is hereby incorporated by reference in its entirety.

BACKGROUND

With the rapid development of technologies, users increasingly rely on mobile terminals in all aspects of their work and life. While using a mobile terminal, as the distance between the user and the mobile terminal is relatively close, the radiation from the mobile device is unavoidable.

SUMMARY

The present disclosure generally relates to the field of terminal technology, and more specifically, to a method for detecting a state of a proximity sensor, an apparatus for detecting the state of the proximity sensor, a terminal and a non-transitory computer-readable storage medium.

According to one aspect of embodiments of the present disclosure, there is provided a method for detecting a state of a proximity sensor, applied to a terminal comprising the proximity sensor and an antenna, the method comprising: sending a predetermined instruction to the proximity sensor; determining whether the proximity sensor is abnormal based on a feedback result of the proximity sensor to the predetermined instruction; and maintaining the antenna transmitting power at a low power when the proximity sensor is abnormal.

In some embodiments, the predetermined instruction comprises a capacitance value detection instruction for enabling the proximity sensor to detect a background capacitance value of a background circuit, wherein the background circuit at least includes the proximity sensor; and the determining whether the proximity sensor is abnormal based on the feedback result of the proximity sensor to the predetermined instruction comprises: when the background capacitance value sent by the proximity sensor in response to the capacitance value detection instruction is received, determining whether an absolute value of difference between the background capacitance value and a standard value is greater than or equal to a deviation threshold; and when the absolute value of the difference between the background capacitance value and the standard value is greater than or equal to the deviation threshold, determining that the proximity sensor is abnormal.

In some embodiments, the determining whether the proximity sensor is abnormal based on the feedback result of the proximity sensor to the predetermined instruction comprises: when the absolute value of the difference between the background capacitance value and the standard value is less than the deviation threshold, enabling the antenna to adjust the transmitting power in real time based on a sensing signal of the proximity sensor.

In some embodiments, the enabling the antenna to adjust the transmitting power in real time based on the signal of the proximity sensor comprises: sending a first instruction to a modem, such that the modem receives the sensing signal of the proximity sensor, and controls the antenna transmitting power in real time based on the sensing signal.

In some embodiments, the determining whether the proximity sensor is abnormal based on the feedback result of the proximity sensor comprises: when a response of the proximity sensor is not received, determining that the proximity sensor is abnormal.

In some embodiments, the predetermined instruction comprises a communication state detection instruction; and the sending the predetermined instruction to the proximity sensor comprises: sending the communication state detection instruction to the proximity sensor periodically when the terminal is turned on and/or after the terminal is turned on.

In some embodiments, the maintaining the antenna transmitting power at the low power comprises: sending a second instruction to the modem, such that the modem controls the antenna transmitting power to maintain a low power, wherein the low power is an antenna transmitting power corresponding to the shortest distance between a human body and the terminal.

In some embodiments, in a case in which the proximity sensor is abnormal, the method further comprises: sending alarm information through the terminal.

In some embodiments, the background circuit is a circuit on a circuit board on which the proximity sensor is mounted.

According to a second aspect of embodiments of the present disclosure, there is provided an apparatus for detecting a state of a proximity sensor, applied to a terminal comprising the proximity sensor and an antenna, the apparatus comprising: a predetermined instruction sending circuit, configured to send a predetermined instruction to the proximity sensor; and a processing circuit, configured to determine whether the proximity sensor is abnormal based on a feedback result of the proximity sensor to the predetermined instruction; and maintain the antenna transmitting power at a low power when the proximity sensor is abnormal.

In some embodiments, the predetermined instruction comprises a capacitance value detection instruction for enabling the proximity sensor to detect a background capacitance value of a background circuit, wherein the background circuit at least includes the proximity sensor; the apparatus for detecting the state of the proximity sensor further comprises: a receiving circuit configured to receive the background capacitance value sent by the proximity sensor in response to the capacitance value detection instruction; and the processing circuit is further configured to determine that the proximity sensor is abnormal when an absolute value of difference between the background capacitance value and the standard value is greater than or equal to a deviation threshold.

In some embodiments, the processing circuit is further configured to: when the absolute value of the difference between the background capacitance value and the standard value is less than the deviation threshold, enable the antenna to adjust the transmitting power in real time based on a sensing signal of the proximity sensor.

In some embodiments, the apparatus further comprises a first sending circuit, and the processing circuit sends a first instruction to a modem through the first sending circuit, such that the modem receives the sensing signal of the proximity sensor, and controls the antenna transmitting power in real time based on the sensing signal.

In some embodiments, the processing circuit is further configured to: when a response of the proximity sensor is not received, determine that the proximity sensor is abnormal.

In some embodiments, the predetermined instruction comprises a communication state detection instruction; and the predetermined instruction sending circuit is further configured to: send the communication state detection instruction to the proximity sensor periodically when the terminal is turned on and/or after the terminal is turned on.

In some embodiments, the apparatus further comprises a second sending circuit, and the processing circuit sends a second instruction to the modem through the second sending circuit, such that the modem controls the antenna transmitting power to maintain a low power, wherein the low power is an antenna transmitting power corresponding to the shortest distance between a human body and the terminal.

In some embodiments, the apparatus further comprises: an alarm circuit, configured to send alarm information through the terminal when the proximity sensor is abnormal.

In some embodiments, the background circuit is a circuit on a circuit board on which the proximity sensor is mounted.

According to a third aspect of embodiments of the present disclosure, there is provided a terminal comprising: a processor; and memory for storing processor-executable instructions, wherein the processor is configured to execute the method for detecting the state of the proximity sensor according to the foregoing first aspect.

According to another aspect of embodiments of the present disclosure, there is provided a non-transitory computer-readable storage medium having instructions stored thereon, wherein the method for detecting the state of the proximity sensor according to the first aspect is executed, when the instructions are executed by a processor.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this disclosure, illustrate embodiments consistent with the present disclosure and, together with the description, serve to explain the principles of the present disclosure.

DETAILED DESCRIPTION

Figure 1:
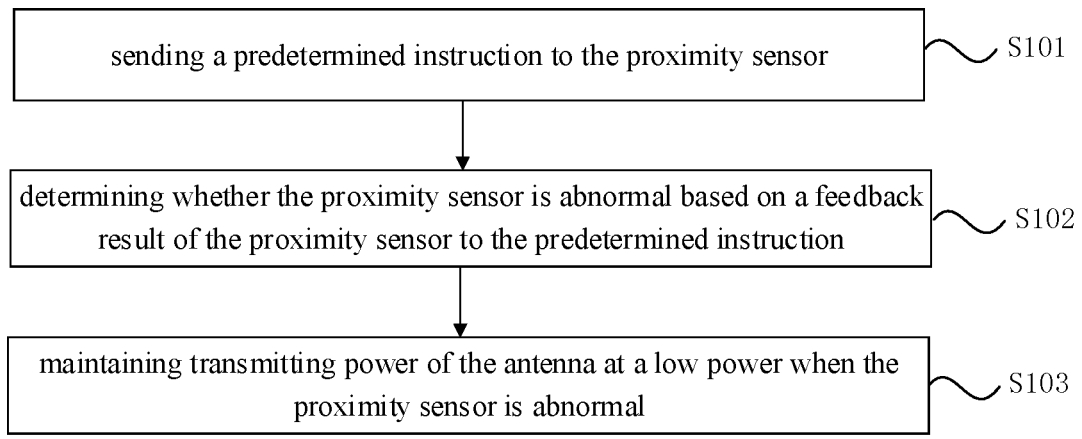
FIG. 1 is a flowchart illustrating a method for detecting a state of a proximity sensor according to some embodiments of the present disclosure.

Description will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

The radiation from the mobile terminal may be harmful to the health of the user. The radiation level of the terminal can be measured by an electromagnetic wave absorption ratio, and in order to monitor the radiation of the mobile terminal, a proximity sensor such as an electromagnetic wave specific absorption ratio sensor (SAR Sensor) can be mounted in the terminal. The electromagnetic wave specific absorption ratio sensor can effectively detect the contact between the human body and the mobile terminal when the distance therebetween is close, report data every time a person approaches, and reduce the transmitting power according to the reported content to reduce the possible adverse effects of the terminal radiation on the human body.

However, when the electromagnetic wave specific absorption ratio sensor cannot effectively monitor the radiation level generated by the terminal, once the radiation level exceeds the normal radiation value, it will bring varying degrees of harm to the human body and endanger the safety of users.

The terminal antenna performance has an important index, that is, an electromagnetic wave absorption ratio SAR for representing the electromagnetic radiation energy absorbed by a unit mass of material per unit time. Under the action of an external electromagnetic field, an induced electromagnetic field will be generated in the human body. Since various organs of the human body are lossy media, the electromagnetic field in the body will generate electric current, which leads to the absorption and dissipation of electromagnetic energy. The meaning of SAR is the electromagnetic power absorbed or consumed per unit mass of human tissue. In the international market, in order to ensure the safety of end users, for example, the European Council and the Federal Communications Commission have high requirements for SAR.

The radiation level of the terminal is measured by SAR, and in order to monitor the radiation of the mobile terminal, a proximity sensor such as a SAR sensor can be mounted in the terminal. The SAR sensor can effectively detect the contact between the human body and the mobile terminal when the distance therebetween is close, report data every time a person approaches, and reduce the transmitting power according to the reported content to reduce the possible adverse effects of terminal radiation on the human body.

However, when the electromagnetic wave specific absorption ratio sensor cannot effectively monitor the level of the radiation generated by the terminal, once the radiation level exceeds the normal radiation value, it will bring varying degrees of harm to the human health and endanger the safety of users.

With respect to the above described problems, the present disclosure provides a method for detecting a state of a proximity sensor, an apparatus for detecting the state of the proximity sensor, a terminal and a non-transitory computer-readable storage medium.

FIG. 1 is a flowchart illustrating a method for detecting a state of a proximity sensor according to some embodiments, and as shown in FIG. 1, the method for detecting the state of the proximity sensor is used in a terminal. The terminal can be, for example, a smart phone, a tablet computer, a wearable device, a PC, or the like, and the embodiments of the present disclosure do not limit the types of devices to be applied. For ease of description, in the following description of the present disclosure, the terminal is a smart phone as an example for description. The terminal applying the present disclosure is provided with a proximity sensor and an antenna, and as shown in FIG. 1, the method for detecting the state of the proximity sensor includes step S101, step S102, and step S103.

In step S101, a predetermined instruction is sent to the proximity sensor.

The proximity sensor is a sensor that can sense the proximity of an object without contact and convert it into an electrical signal. For a terminal provided with a proximity sensor, it can be configured to perform proximity detection through the proximity sensor, so as to detect whether there is an object approaching a certain position of the smart terminal, and trigger the corresponding function. For example, while using a smart phone to make and receive a phone call, the proximity sensor can be used to detect whether there is an object approaching the handset of the phone. When it is determined that the user's head and face are close to the phone, the smart phone can be triggered to turn off the screen, etc.

In the embodiments of the present disclosure, the proximity sensor is a SAR sensor, and the SAR sensor is used to detect the contact between the human body and the phone when the distance therebetween is close and report data every time a person approaches.

In step S102, it is determined whether the proximity sensor is abnormal based on a feedback result of the proximity sensor to the predetermined instruction.

After sending the predetermined instruction to the SAR sensor, it is determined whether the SAR sensor is abnormal according to the actual different feedback results.

Figure 2:
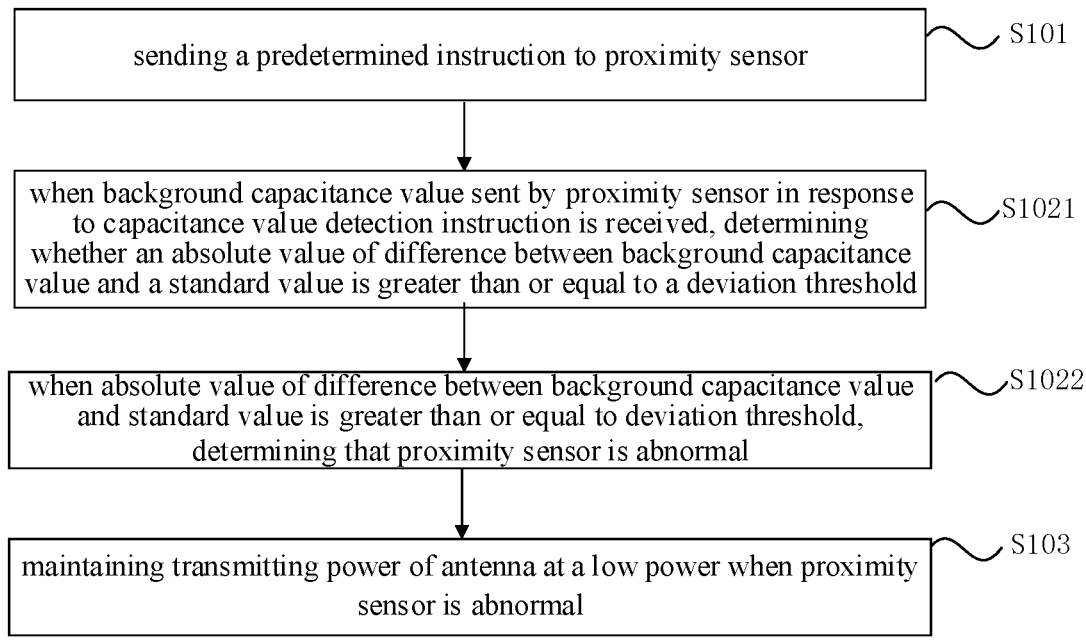
FIG. 2 is a flowchart illustrating a method for detecting a state of a proximity sensor according to some embodiments of the present disclosure.

In some embodiments, as shown in FIG. 2, the predetermined instruction includes a capacitance value detection instruction, the host sends the capacitance value detection instruction for enabling the SAR sensor to detect a background capacitance value of a background circuit to the SAR sensor. The SAR sensor detects the background capacitance value of the background circuit in response to the received capacitance value detection instruction. The background circuit can be adjacent to or enclose the SAR sensor, e.g., a circuit surrounding the SAR sensor and having the SAR sensor therein. For example, the SAR sensor is mounted on a circuit board, the background circuit can be the circuit on the circuit board, and the background capacitance value can be the capacitance value of the circuit board.

The step S102 can include step S1021 and step S1022, in step S1021, if the background capacitance value sent by the proximity sensor in response to the capacitance value detection instruction is received, it is determined whether an absolute value of difference between the background capacitance value and a standard value is greater than or equal to a deviation threshold; and in step S1022, if the absolute value of the difference between the background capacitance value and the standard value is greater than or equal to the deviation threshold, it is determined that the proximity sensor is abnormal.

In response to the received capacitance value detection instruction, the SAR sensor can be triggered to perform a self-calibration, that is, to detect the background capacitance value of the background circuit. And the detected background capacitance value is sent to the host.

The background capacitance value of the background circuit is the capacitance value of the background circuit including the SAR sensor. It can be understood that the standard value compared with the background capacitance value is the capacitance value of the SAR sensor when data of the SAR sensor antenna of the phone is calibrated when the phone is shipped from the factory, that is, when there is no human contact. Different terminals have different standard values and background capacitance values according to their different configurations.

In the embodiments of the present disclosure, due to the working characteristic of the SAR sensor and the damage of the phone components in use, the capacitor of the background circuit including the SAR sensor or other components may be depreciated and invalid. At this time, the SAR sensor cannot work normally. The deviation threshold is set in advance, and in the determination process, it is determined whether the absolute value of the difference between the background capacitance value and the standard value is greater than or equal to the deviation threshold.

When the absolute value of the difference between the background capacitance value and the standard value is greater than or equal to the deviation threshold, it is determined that the SAR sensor cannot work normally.

When the absolute value of the difference between the background capacitance value and the standard value is less than the deviation threshold, it is determined that the SAR sensor can work normally.

When determining that the SAR sensor cannot work normally, it is determined that there is an abnormality, and a SAR value for representing the radiation produced by the phone cannot be obtained. When the human body is close to the phone, since the radiation situation cannot be determined, the antenna transmitting power of the phone is not reduced, such that the phone still maintains a higher power to work, and thus greater electromagnetic wave radiation is generated to the user, which brings harm to the user's body.

In step S103, if the proximity sensor is abnormal, the antenna transmitting power is maintained at a low power.

In the embodiments of the present disclosure, the low power can be the lowest antenna transmitting power of the phone, that is, can be the corresponding antenna transmitting power when the shortest distance between the human body and the terminal is detected in a case that the SAR sensor works normally. By maintaining the antenna transmitting power of the phone at the lowest transmitting power, the radiation of the phone is reduced, which not only ensures the normal use of the phone, but also ensures the safety of the user.

According to the embodiments of the present disclosure, it is determined whether the proximity sensor can work normally through the acquisition of the capacitance value by the proximity sensor, and when it is determined that the proximity sensor cannot work normally, the antenna transmitting power is directly reduced and maintained at a low power level, thereby avoiding the situation that the antenna transmitting power is still high when the human body approaches due to the inability of the proximity sensor to work normally, and reducing the radiation hazard to the human body.

Figure 3:
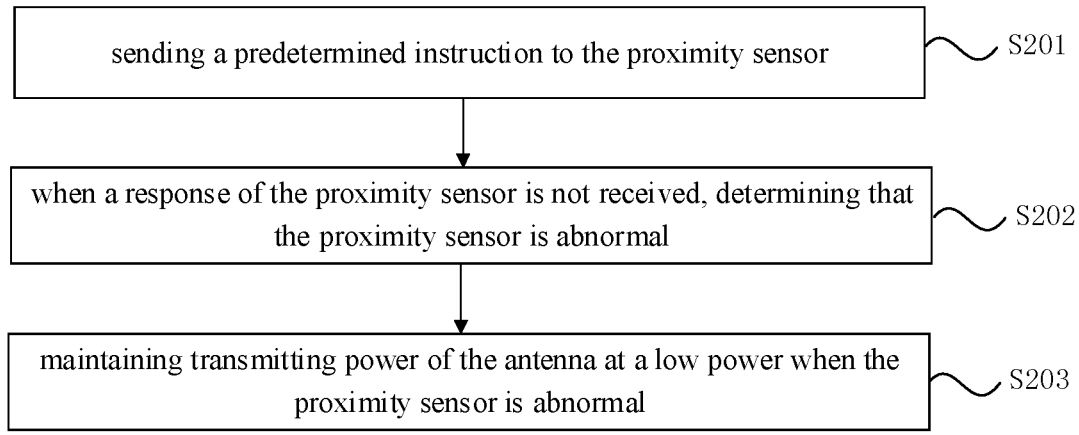
FIG. 3 is a flowchart illustrating a method for detecting a state of a proximity sensor according to some embodiments of the present disclosure.

FIG. 3 is a flowchart illustrating a method for detecting a state of a proximity sensor according to some embodiments of the present disclosure. As shown in FIG. 3, the method for detecting the state of the proximity sensor includes the following steps.

In step S201, a predetermined instruction is sent to the proximity sensor.

In step S202, when no response from the proximity sensor is received, it is determined that the proximity sensor is abnormal.

In step S203, when the proximity sensor is abnormal, the antenna transmitting power is maintained at a low power.

After sending the predetermined instruction to the proximity sensor, if no response from the SAR sensor is received, there may be abnormal communication with the SAR sensor, and when the communication between the host and the SAR sensor chip fails, the data of the SAR sensor for determining the distance between the human body and the terminal cannot be obtained, and thus the antenna transmitting power cannot be adjusted specifically according to the distance from the human body. Therefore, it can also be determined that the SAR sensor cannot work normally, that is, there is an abnormality.

When it is determined that the SAR sensor cannot work normally, the SAR value for representing the radiation generated by the phone cannot be obtained. When the human body is close to the phone, since the radiation situation cannot be determined, the antenna transmitting power of the phone is not reduced, such that the phone still maintains a high power to work, and thus greater electromagnetic wave radiation is generated to the user, which brings harm to the user's body.

In order to reduce the user's physical damage that may be caused by excessive radiation, the antenna transmitting power is maintained at a low power, that is, the phone is maintained at the lowest antenna transmitting power to work. By maintaining the antenna transmitting power of the phone at the lowest transmitting power to reduce the radiation of the phone, not only the normal use of the phone but also the safety of the user is ensured.

In some embodiments, the predetermined instruction includes a communication state detection instruction; and the sending the predetermined instruction to the proximity sensor includes sending a communication state detection instruction to the proximity sensor periodically when the terminal is turned on and/or after the terminal is turned on.

In the embodiment, the communication state detection instruction can be sent to the SAR sensor to detect whether the communication state with the SAR sensor is normal. The sending can be performed when the terminal is turned on to detect the communication state, or the detection can be periodically made after the terminal is turned on, that is, one communication state detection instruction is sent at a certain interval, and the feedback of the communication state detection instruction can be made through the SAR sensor to determine whether there is a communication abnormality, and in general, it can be determined that the communication is normal by enabling the SAR sensor return a feedback signal to confirm the reception after receiving the communication state detection instruction, and if the feedback signal is not received, it means that there is a communication abnormality. Herein, the communication state detection instruction can be sent to the SAR sensor through any one of the communication methods such as I2C (Inter-Integrated Circuit, two-wire serial bus), I2S (Inter-Integrated Circuit Sound, integrated circuit built-in audio bus), USB (Universal Serial Bus), and PCI (Peripheral Component Interconnect, peripheral component interconnect standard).

According to the embodiments of the present disclosure, the communication state of the SAR sensor is determined in the above described manner to avoid the inability to obtain the detection data of the SAR sensor due to the abnormal communication state and the inability to reduce the antenna power when the human body approaches. Therefore, the situation that the antenna transmitting power is still high when the human body approaches due to the inability of the SAR sensor to work normally is avoided, and the radiation hazard to the human body is reduced.

In some embodiments, a second instruction is sent to the modem, such that the modem controls the antenna transmitting power to maintain a low power, wherein the low power is an antenna transmitting power corresponding to the shortest distance between the human body and the terminal.

In the embodiments of the present disclosure, when the absolute value of the difference between the background capacitance value and the standard value is greater than or equal to the deviation threshold, or the communication between the host and the SAR sensor chip fails, it is determined that the SAR sensor cannot work normally.

When it is determined that the SAR sensor cannot work normally, the host sends a second instruction to the modem, and the second instruction is used to notify the modem to control the antenna transmitting power to maintain a low power, that is, to maintain the phone to work at the lowest antenna transmitting power. It avoids the situation that the antenna transmitting power is still higher when the human body approaches due to the inability of the proximity sensor to work normally, and reduces the radiation hazard to the human body.

In some embodiments, when the proximity sensor is abnormal, the method for detecting the state of the proximity sensor can further include: sending alarm information through the terminal.

In the embodiments of the present disclosure, when the absolute value of the difference between the background capacitance value and the standard value is greater than or equal to the deviation threshold, or the communication between the host and the SAR sensor chip fails, it is determined that the SAR sensor cannot work normally.

When it is determined that the SAR sensor cannot work normally, the alarm information is sent through the terminal.

For example, the sending the alarm information through the terminal can be that prompt information is displayed on the terminal display screen to remind the user that the SAR sensor cannot work normally and the terminal being used may have excessive radiation, and the antenna transmitting power is reduced for the user to choose and deal with.

The user can determine whether to accept the operation of reducing the phone transmitting power of the antenna according to actual usage requirements. It can be understood that the operation of reducing the phone transmitting power of the antenna may reduce the signal quality during the use of the phone and affect the user experience. When a user needs to use the phone for important, high-level operation, it can be selected not to accept the operation of reducing the antenna transmitting power of the phone according to the prompts to keep the phone with good signal quality to be used.

When the user uses the phone to perform the general operation, it can be selected to accept the operation of reducing the antenna transmitting power of the phone according to the prompts to reduce the radiation of the phone to the human body and ensure safety. Alternatively, the use time of phone can be reasonably reduced and SAR sensor failures can be dealt with in time.

The sending the alarm information through the terminal can also be sending a sound reminder at the terminal, for example, sending an alarm sound, a prompt sound, etc., to remind the user that the SAR sensor cannot work normally and there may be excessive radiation if the terminal is used, for the user to choose and deal with.

The sending the alarm information through the terminal can also be sending error-reporting information to the cloud server. The cloud server can obtain the fault information of the SAR sensor in the phone, which is convenient for information collection and product fault processing, so as to improve the quality of the phone and provide better service to users.

According to the embodiments of the present disclosure, the alarm information is sent through the terminal to further provide the user with active choice, which avoids the situation that the antenna transmitting power is still high when the human body approaches due to the inability of the proximity sensor to work normally, reduces the radiation hazard to the human body, and ensures the normal use of the terminal in critical situations.

Figure 4:
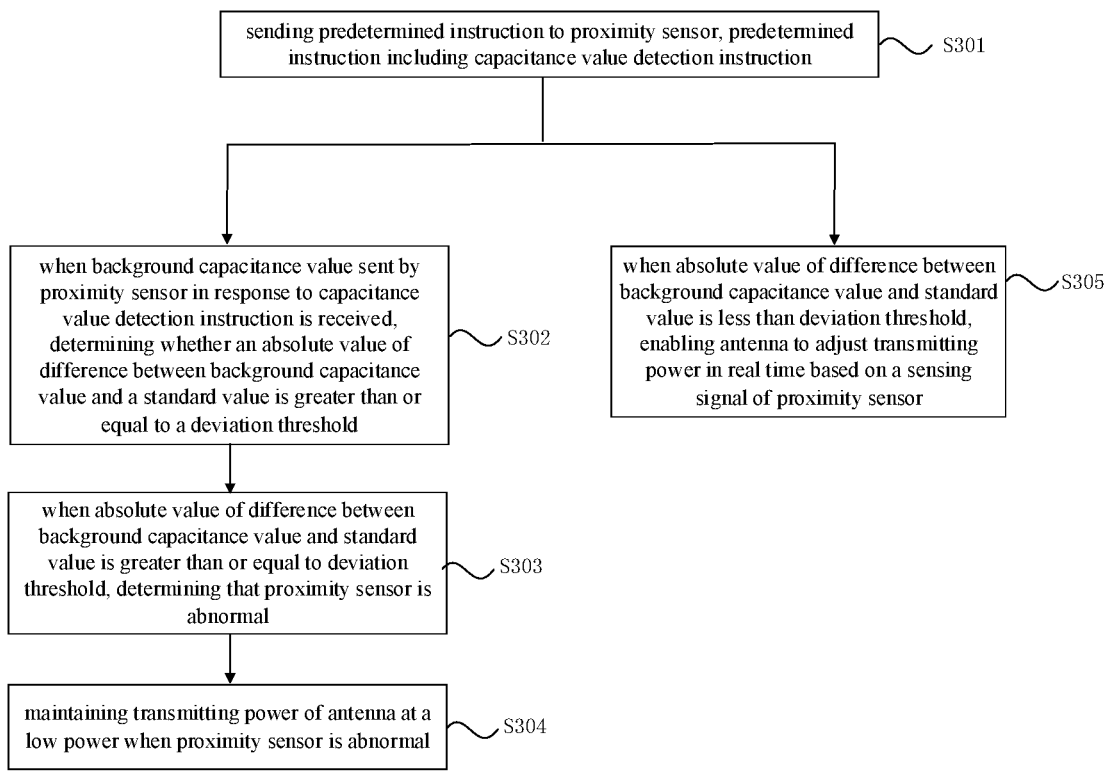
FIG. 4 is a flowchart illustrating a method for detecting a state of a proximity sensor according to some embodiments of the present disclosure.

FIG. 4 is a flowchart illustrating a method for detecting a state of a proximity sensor according to some embodiments of the present disclosure. As shown in FIG. 4, the method for detecting the state of the proximity sensor includes the following steps.

In step S301, a predetermined instruction is sent to the proximity sensor, wherein the predetermined instruction includes a capacitance value detection instruction for enabling the proximity sensor to detect a background capacitance value of a background circuit, and the background circuit at least includes the proximity sensor.

In step S302, when the background capacitance value sent by the proximity sensor in response to the capacitance value detection instruction is received, it is determined whether the absolute value of the difference between the background capacitance value and the standard value is greater than or equal to the deviation threshold.

In step S303, when the absolute value of the difference between the background capacitance value and the standard value is greater than or equal to the deviation threshold, it is determined that the proximity sensor is abnormal.

In step S304, when the proximity sensor is abnormal, the antenna transmitting power is maintained at a low power.

In step S305, when the absolute value of the difference between the background capacitance value and the standard value is less than the deviation threshold, the antenna is enabled to adjust the transmitting power in real time based on a sensing signal of the proximity sensor.

In the embodiments of the present disclosure, when the absolute value of the difference between the background capacitance value and the standard value is greater than or equal to the deviation threshold, or the communication between the host and the SAR sensor chip fails, it is determined that the SAR sensor cannot work normally.

When it is determined that the SAR sensor cannot work normally, the host sends a second instruction to the modem, and the second instruction is used to notify the modem to control the antenna transmitting power to maintain a low power, that is, to maintain the phone to work at the lowest antenna transmitting power.

The host sends the capacitance value detection instruction to the SAR sensor, and the capacitance value detection instruction is used to enable the SAR sensor to detect the background capacitance value of the background circuit. The SAR sensor detects the background capacitance value of the background circuit in response to the received capacitance value detection instruction.

The SAR sensor detects the background capacitance value of the background circuit in response to the received capacitance value detection instruction, and sends the detected background capacitance value to the host.

When the absolute value of the difference between the background capacitance value and the standard value is less than the deviation threshold, it is determined that the SAR sensor can work normally.

When it is determined that the SAR sensor can work normally after re-detecting, in order to bring good communication signal quality to the user, the antenna transmitting power of the phone is restored to the normal working level, such that the antenna can adjust the transmitting power in real time based on the sensing signal of the proximity sensor.

According to the embodiments of the present disclosure, when it is determined that the SAR sensor cannot work normally, the antenna transmitting power is controlled to be maintained at a low power, that is, the phone is maintained to work at the lowest antenna transmitting power. When it is determined that the SAR sensor can work normally after re-detecting, the antenna is enabled to adjust the transmitting power in real time based on the sensing signal of the proximity sensor. It prevents the user from being exposed to high radiation, in this way, not only is the safety of users ensured, but also the transmitting power can be adjusted in time according to the sensing signal of the SAR sensor, thereby ensuring the communication quality of the phone and improving the user experience.

In some embodiments, in step S305, when the absolute value of the difference between the background capacitance value and the standard value is less than the deviation threshold, the first instruction can be sent to the modem to enable the modem to receive the sensing signal of the proximity sensor.

In the embodiments of the present disclosure, when the absolute value of the difference between the background capacitance value and the standard value is greater than or equal to the deviation threshold, or the communication between the host and the SAR sensor chip fails, it is determined that the SAR sensor cannot work normally.

When it is determined that the SAR sensor cannot work normally, the host sends a second instruction to the modem, and the second instruction is used to notify the modem to control the antenna transmitting power to maintain a low power, that is, to maintain the phone to work at the lowest antenna transmitting power.

When it is determined that the SAR sensor can work normally after re-detecting, in order to bring good communication signal quality to the user, the antenna transmitting power of the phone is restored to the normal working level, that is, the antenna is enabled to adjust the transmitting power based on the sensing signal of the SAR sensor.

The antenna transmitting power is controlled in real time based on the comparison between the sensing signal of the SAR sensor and the standard value. For example, the linear adjustment can be performed according to the absolute value of the difference between the sensing signal and the standard value, and the proportional relationship with the standard value, or other adjustment methods.

According to the embodiments of the present disclosure, by controlling the modem to receive the sensing signal of the SAR sensor, the antenna transmitting power is controlled in real time based on the sensing signal, the influence of phone radiation on the human body and the strength of the phone signal are considered in aggregate, the antenna transmitting power of the phone is adjusted in time, such that the adjustment of the transmitting power is more effective, and the user's normal phone experience is ensured.

In some embodiments, the background circuit is a circuit on a circuit board, and the proximity sensor is mounted on the circuit board.

In the embodiments of the present disclosure, the capacitance detected by the SAR sensor is the capacitance of the circuit board where the SAR sensor is mounted, that is, the capacitance detected by the SAR sensor includes the capacitance of other components on the circuit board and the SAR sensor itself.

The background circuit including the SAR sensor is a circuit surrounding the SAR sensor and including the SAR sensor. The circuit is mounted on a circuit board, which can be a rigid circuit board or a flexible circuit board. The rigid circuit board can be, for example, a rigid printed circuit board, which has low cost, simpler structure and easy assembly.

The flexible circuit board can be bent, twisted or folded arbitrarily, with characteristics of flexible assembly and low requirements for assembly space, and widely used.

Based on the same concept, the embodiments of the present disclosure also provide an apparatus for detecting the state of the proximity sensor.

It can be understood that, in order to implement the above functions, the apparatus for detecting the state of the proximity sensor provided by the embodiments of the present disclosure includes a corresponding hardware structure and/or software module for executing each function. In combination with the units and algorithm steps of the respective examples disclosed in the embodiments of the present disclosure, the embodiments of the present disclosure can be implemented in the form of hardware or a combination of hardware and computer software. Whether a function is executed by the hardware or a method of driving the hardware by the computer software depends on the specific application and design constraints of the technical solution. A person skilled in the art may use different methods to implement the described functions for each specific application, but such implementation should not be considered to exceed the scope of the technical solutions of the embodiments of the present disclosure.

Figure 5:
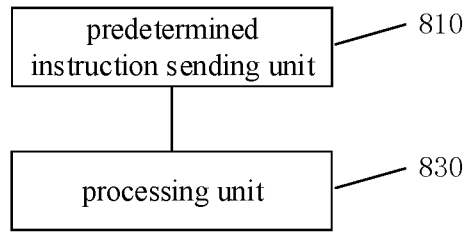
FIG. 5 is a block diagram illustrating an apparatus for detecting a state of a proximity sensor according to some embodiments of the present disclosure.

FIG. 5 is a block diagram illustrating an apparatus for detecting a state of a proximity sensor according to some embodiments. The apparatus for detecting the state of the proximity sensor is applied to a terminal, and the terminal includes a proximity sensor and an antenna. Referring to FIG. 5, an apparatus 800 for detecting the state of the proximity sensor includes a predetermined instruction sending circuit 810 and a processing circuit 830.

The predetermined instruction sending circuit 810 is configured to send a predetermined instruction to the proximity sensor.

The processing circuit 830 is configured to determine whether the proximity sensor is abnormal based on a feedback result of the proximity sensor to the predetermined instruction; and maintain the antenna transmitting power at a low power if the proximity sensor is abnormal.

Figure 6:
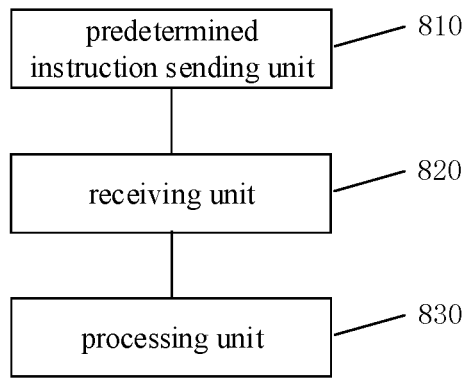
FIG. 6 is a block diagram illustrating an apparatus for detecting a state of a proximity sensor according to some embodiments of the present disclosure.

FIG. 6 is a block diagram illustrating an apparatus for detecting a state of a proximity sensor according to some embodiments, and referring to FIG. 6, in some embodiments, the predetermined instruction includes a capacitance value detection instruction for enabling the proximity sensor to detect a background capacitance value of a background circuit, wherein the background circuit at least includes the proximity sensor; the apparatus 800 for detecting the state of the proximity sensor further includes: a receiving circuit 820 configured to receive the background capacitance value sent by the proximity sensor in response to the capacitance value detection instruction; and a processing circuit 830 further configured to determine that the proximity sensor is abnormal if an absolute value of difference between the background capacitance value and a standard value is greater than or equal to a deviation threshold.

In some embodiments, the processing circuit 830 is further configured to: if the absolute value of the difference between the background capacitance value and the standard value is less than the deviation threshold, enable the antenna to adjust the transmitting power in real time based on a sensing signal of the proximity sensor.

Figure 7:
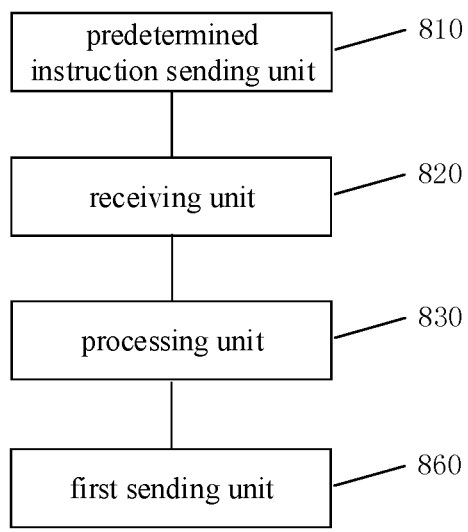
FIG. 7 is a block diagram illustrating an apparatus for detecting a state of a proximity sensor according to some embodiments of the present disclosure.

FIG. 7 is a block diagram illustrating an apparatus for detecting a state of a proximity sensor according to some embodiments, and referring to FIG. 7, the apparatus 800 for detecting the state of the proximity sensor further includes a first sending circuit 860, and the processing circuit 830 sends a first instruction to the modem through the first sending circuit 860, such that the modem receives the sensing signal of the proximity sensor, and the antenna transmitting power is controlled in real time based on the sensing signal.

In some embodiments, the processing circuit 830 is further configured to determine that the proximity sensor is abnormal if a response of the proximity sensor is not received.

In some embodiments, the predetermined instruction includes a communication state detection instruction; and the predetermined instruction sending circuit 810 is further configured to: send the communication state detection instruction to the proximity sensor periodically when the terminal is turned on and/or after the terminal is turned on.

Figure 8:
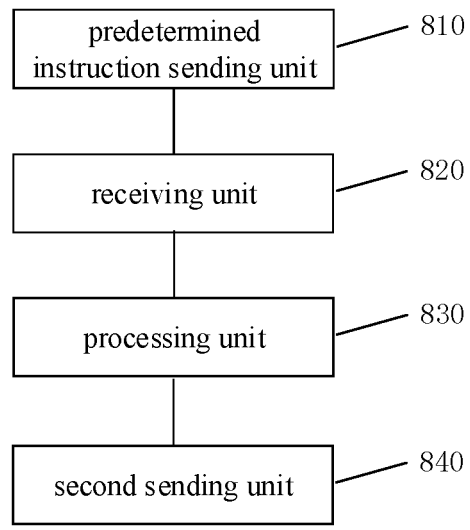
FIG. 8 is a block diagram illustrating an apparatus for detecting a state of a proximity sensor according to some embodiments of the present disclosure.

FIG. 8 is a block diagram illustrating an apparatus for detecting a state of a proximity sensor according to some embodiments, and referring to FIG. 8, the apparatus 800 for detecting the state of the proximity sensor includes a second sending circuit 840.

The processing circuit 830 sends a second instruction to the modem through the second sending circuit 840, such that the modem controls the antenna transmitting power to maintain a low power, wherein the low power is an antenna transmitting power corresponding to the shortest distance between the human body and the terminal.

Figure 9:
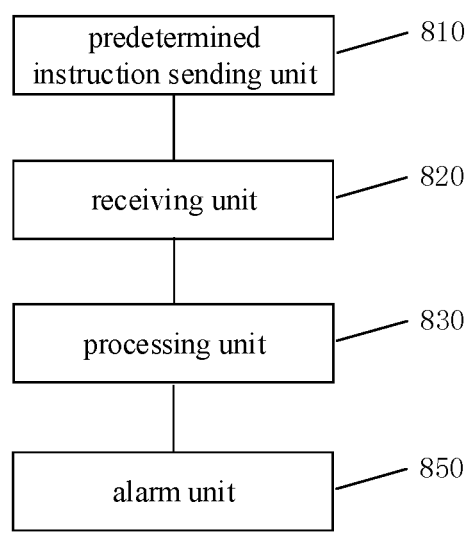
FIG. 9 is a block diagram illustrating an apparatus for detecting a state of a proximity sensor according to some embodiments of the present disclosure.

FIG. 9 is a block diagram illustrating an apparatus for detecting a state of a proximity sensor according to some embodiments, and referring to FIG. 9, the apparatus 800 for detecting the state of the proximity sensor includes an alarm circuit 850.

The alarm circuit 850 is configured to send alarm information through the terminal when the proximity sensor is abnormal.

In some embodiments, the background circuit is a circuit on a circuit board, and the proximity sensor is mounted on the circuit board.

With respect to the apparatuses in the above embodiments, the specific manners for performing operations for individual modules therein have been described in detail in the embodiments regarding the methods, which will not be elaborated herein.

Figure 10:
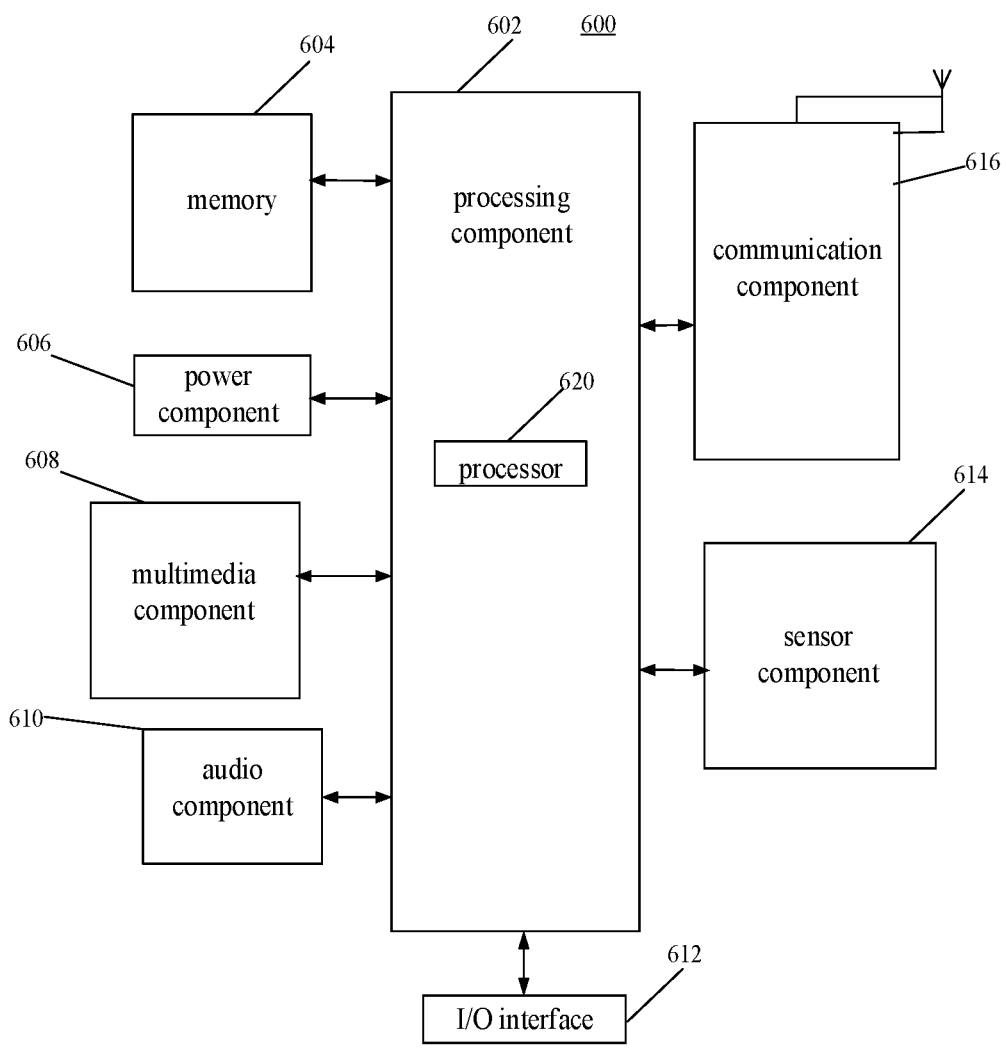
FIG. 10 is a block diagram illustrating a device according to some embodiments of the present disclosure.

FIG. 10 is a block diagram illustrating a device 600 for detecting a state of a proximity sensor according to some embodiments. For example, the device 600 can be a phone, a computer, a digital broadcast terminal, a messaging device, a gaming console, a tablet, a medical device, exercise equipment, a personal digital assistant, and the like.

Referring to FIG. 10, the device 600 may include one or more of the following components: a processing component 602, a memory 604, a power component 606, a multimedia component 608, an audio component 610, an input/output (I/O) interface 612, a sensor component 614, and a communication component 616.

The processing component 602 typically controls overall operations of the device 600, such as the operations associated with display, telephone calls, data communications, camera operations, and recording operations. The processing component 602 may include one or more processors 620 to execute instructions to implement all or part of the steps in the above described methods. Moreover, the processing component 602 may include one or more modules which facilitate the interaction between the processing component 602 and other components. For instance, the processing component 602 may include a multimedia module to facilitate the interaction between the multimedia component 608 and the processing component 602.

The memory 604 is configured to store various types of data to support the operation of the device 600. Examples of such data include instructions for any applications or methods operated on the device 600, contact data, phonebook data, messages, pictures, videos, etc. The memory 604 may be implemented by using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 606 supplies power to various components of the device 600. The power component 606 may include a power management system, one or more power sources, and other components associated with the generation, management, and distribution of power in the device 600.

The multimedia component 608 includes a screen providing an output interface between the device 600 and a user. In some embodiments, the screen may include a liquid crystal display (LCD) and a touch panel (TP). In some embodiments, an organic light-emitting diode (OLED) display can be employed.

If the screen includes the touch panel, the screen can be implemented as a touch screen to receive input signals from the user. The touch panel includes one or more touch sensors to sense touches, swipes, and gestures on the touch panel. The touch sensors can not only sense a boundary of a touch or swipe action, but also sense a period of time and a pressure associated with the touch or swipe action. In some embodiments, the multimedia component 608 includes a front camera and/or a rear camera. The front camera and/or the rear camera can receive external multimedia data while the device 600 is in an operation mode, such as a photographing mode or a video mode. Each of the front camera and the rear camera may be a fixed optical lens system or have focus and optical zoom capability.

The audio component 610 is configured to output and/or input audio signals. For example, the audio component 610 includes a microphone (MIC) configured to receive an external audio signal when the device 600 is in an operation mode, such as a call mode, a recording mode, and a voice recognition mode. The received audio signal can be further stored in the memory 604 or transmitted via the communication component 616. In some embodiments, the audio component 610 further includes a speaker to output audio signals.

The I/O interface 612 provides an interface between the processing component 602 and peripheral interface modules, such as a keyboard, a click wheel, buttons, and the like. The buttons may include, but are not limited to, a home button, a volume button, a starting button, and a locking button.

The sensor component 614 includes one or more sensors to provide status assessments of various aspects of the device 600. For instance, the sensor component 614 can detect an on/off status of the device 600, relative positioning of components, e.g., the display and a keypad, of the device 600, the sensor component 614 can also detect a change in position of the device 600 or one component of the device 600, a presence or absence of user contact with the device 600, an orientation or an acceleration/deceleration of the device 600, and a change in temperature of the device 600. The sensor component 614 may include a proximity sensor configured to detect the presence of nearby objects without any physical contact. The sensor component 614 may also include a light sensor, such as a CMOS or CCD image sensor, for use in imaging applications. In some embodiments, the sensor component 614 can also include an accelerometer sensor, a gyroscope sensor, a magnetic sensor, a pressure sensor, or a temperature sensor.

The communication component 616 is configured to facilitate wired or wireless communication between the device 600 and other devices. The device 600 can access a wireless network based on a communication standard, such as Wi-Fi, 2G, 3G, 4G, or 5G, or a combination thereof. In one exemplary embodiment, the communication component 616 receives a broadcast signal or broadcast associated information from an external broadcast management system via a broadcast channel. In one exemplary embodiment, the communication component 616 further includes a near field communication (NFC) module to facilitate short-range communications. For example, the NFC module can be implemented based on a radio frequency identification (RFID) technology, an infrared data association (IrDA) technology, an ultra-wideband (UWB) technology, a Bluetooth (BT) technology, and other technologies.

In exemplary embodiments, the device 600 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In exemplary embodiments, there is also provided a non-transitory computer-readable storage medium including instructions, such as the memory 604 including the instructions executable by the processor 620 in the device 600, for completing the above described methods for detecting the state of the proximity sensor. For example, the non-transitory computer-readable storage medium can be a ROM, a random access memory (RAM), a CD-ROM, a magnetic tape, a floppy disc, an optical data storage device, and the like.

Various embodiments of the present disclosure can have the following advantages: through the feedback of the proximity sensor to the request to obtain the capacitance value, it is determined whether the proximity sensor can work normally, and in a case that the proximity sensor cannot work normally, the antenna transmitting power is directly reduced and maintained at a low power level, thereby avoiding the situation that the antenna transmitting power is still high when the human body is approaching due to the inability of the proximity sensor to work normally, which reduces the radiation hazard to the human body.

The various device components, circuits, units, blocks, or portions may have modular configurations, or are composed of discrete components, but nonetheless can be referred to as "modules," "components," or "circuits" in general. In other words, the "components," "modules," "blocks," "circuits," "portions," or "units" referred to herein may or may not be in modular forms, and these phrases may be interchangeably used.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In some embodiments, the control and/or interface software or app can be provided in a form of a non-transitory computer-readable storage medium having instructions stored thereon is further provided. For example, the non-transitory computer-readable storage medium can be a ROM, a CD-ROM, a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more portions of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium can be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a stand-alone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer.

Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

It may be further understood that terms "first", "second", etc. are used to describe various types of information, but the information should not be limited to these terms. These terms are only used to distinguish the same type of information from each other, and do not indicate a specific order or degree of importance. In fact, expressions such as "first" and "second" may be used interchangeably. For example, without departing from the scope of the present disclosure, first information may also be referred to as second information, and similarly, the second information may also be referred to as the first information.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

What is claimed is:

1. A method for detecting a state of a proximity sensor, applied to a terminal comprising the proximity sensor and an antenna, the method comprising:
    sending a predetermined instruction to the proximity sensor;
    determining whether the proximity sensor is abnormal based on a feedback result of the proximity sensor to the predetermined instruction; and
    maintaining transmitting power of the antenna at a reduced power when the proximity sensor is abnormal,
    wherein the predetermined instruction comprises a capacitance value detection instruction for enabling the proximity sensor to detect a background capacitance value of a background circuit, wherein the background circuit at least includes the proximity sensor; and
    the determining whether the proximity sensor is abnormal based on the feedback result of the proximity sensor to the predetermined instruction comprises: when the background capacitance value sent by the proximity sensor in response to the capacitance value detection instruction is received, determining whether an absolute value of difference between the background capacitance value and a standard value is greater than or equal to a deviation threshold; and when the absolute value of the difference between the background capacitance value and the standard value is greater than or equal to the deviation threshold, determining that the proximity sensor is abnormal.

2. The method for detecting the state of the proximity sensor according to claim 1, wherein the determining whether the proximity sensor is abnormal based on the feedback result of the proximity sensor to the predetermined instruction comprises:
    when the absolute value of the difference between the background capacitance value and the standard value is less than the deviation threshold, enabling the antenna to adjust the transmitting power in real time based on a sensing signal of the proximity sensor.

3. The method for detecting the state of the proximity sensor according to claim 2, wherein the enabling the antenna to adjust the transmitting power in real time based on the signal of the proximity sensor comprises:
    sending a first instruction to a modem, such that the modem receives the sensing signal of the proximity sensor, and controls the antenna transmitting power in real time based on the sensing signal.

4. The method for detecting the state of the proximity sensor according to claim 1, wherein the determining whether the proximity sensor is abnormal based on the feedback result of the proximity sensor comprises:
    when a response of the proximity sensor is not received, determining that the proximity sensor is abnormal.

5. The method for detecting the state of the proximity sensor according to claim 1, wherein the maintaining the antenna transmitting power at the reduced power comprises:
    sending a second instruction to the modem, such that the modem controls the antenna transmitting power to maintain a low power, wherein the low power is an antenna transmitting power corresponding to a shortest distance between a human body and the terminal.

6. The method for detecting the state of the proximity sensor according to claim 1, wherein in a case that the proximity sensor is abnormal, the method further comprises:
    sending alarm information through the terminal.

7. The method for detecting the state of the proximity sensor according to claim 1, wherein the background circuit is a circuit on a circuit board on which the proximity sensor is mounted.

8. An apparatus for detecting a state of a proximity sensor, applied to a terminal comprising the proximity sensor and an antenna, the apparatus comprising:
    a predetermined instruction sending circuit, configured to send a predetermined instruction to the proximity sensor; and
    a processing circuit, configured to determine whether the proximity sensor is abnormal based on a feedback result of the proximity sensor to the predetermined instruction; and maintain the antenna transmitting power at a reduced power when the proximity sensor is abnormal,
    wherein the predetermined instruction comprises a capacitance value detection instruction for enabling the proximity sensor to detect a background capacitance value of a background circuit, wherein the background circuit at least includes the proximity sensor;
    the apparatus for detecting the state of the proximity sensor further comprises: a receiver configured to receive the background capacitance value sent by the proximity sensor in response to the capacitance value detection instruction; and
    the processing circuit is further configured to determine that the proximity sensor is abnormal when an absolute value of difference between the background capacitance value and a standard value is greater than or equal to a deviation threshold.

9. A terminal implementing the method of claim 1, comprising:
    a processor; and
    memory for storing processor-executable instructions,
    wherein the processor is configured to execute steps of the method.

10. The terminal according to claim 9, wherein the terminal is configured to:
    determine, based on the feedback result of the proximity sensor to a request to obtain a capacitance value, whether the proximity sensor is capable of functioning normally; and in response to that the proximity sensor is not capable of functioning normally, reduce the antenna transmitting power to avoid a continuous high antenna transmitting power resulting from the proximity sensor not capable of functioning normally, thereby reducing radiation to a user.

11. A method for detecting a state of a proximity sensor, applied to a terminal comprising the proximity sensor and an antenna, the method comprising:
sending a predetermined instruction to the proximity sensor;
determining whether the proximity sensor is abnormal based on a feedback result of the proximity sensor to the predetermined instruction; and
maintaining transmitting power of the antenna at a reduced power when the proximity sensor is abnormal;
wherein the determining whether the proximity sensor is abnormal based on the feedback result of the proximity sensor comprises:
when a response of the proximity sensor is not received, determining that the proximity sensor is abnormal;
wherein the predetermined instruction comprises a communication state detection instruction; and
the sending the predetermined instruction to the proximity sensor comprises: sending the communication state detection instruction to the proximity sensor periodically when the terminal is turned on and/or after the terminal is turned on.

12. The apparatus for detecting the state of the proximity sensor according to claim 8, wherein the background circuit is a circuit on a circuit board on which the proximity sensor is mounted.

13. The apparatus for detecting the state of the proximity sensor according to claim 8, wherein the processing circuit is further configured to: when the absolute value of the difference between the background capacitance value and the standard value is less than the deviation threshold, enable the antenna to adjust the transmitting power in real time based on a sensing signal of the proximity sensor.

14. The apparatus for detecting the state of the proximity sensor according to claim 13, wherein the apparatus further comprises a first sending circuit, and the processing circuit is configured to send a first instruction to a modem through the first sending circuit, such that the modem receives the sensing signal of the proximity sensor, and controls the antenna transmitting power in real time based on the sensing signal.

15. The apparatus for detecting the state of the proximity sensor according to claim 8, wherein the processing circuit is further configured to:
when a response of the proximity sensor is not received, determine that the proximity sensor is abnormal.

16. The apparatus for detecting the state of the proximity sensor according to claim 15, wherein the predetermined instruction comprises a communication state detection instruction; and
the predetermined instruction sending circuit is further configured to: send the communication state detection instruction to the proximity sensor periodically when the terminal is turned on and/or after the terminal is turned on.

17. The apparatus for detecting the state of the proximity sensor according to claim 8, wherein the apparatus further comprises a second sending circuit, and the processing circuit is configured to send a second instruction to the modem through the second sending circuit, such that the modem controls the antenna transmitting power to maintain a low power, wherein the low power is an antenna transmitting power corresponding to the shortest distance between a human body and the terminal.

18. The apparatus for detecting the state of the proximity sensor according to claim 8, wherein the apparatus further comprises:
an alarm circuit, configured to send alarm information through the terminal when the proximity sensor is abnormal.

* * * * *